United States Patent [19]

Fales

[11] 4,001,802
[45] Jan. 4, 1977

[54] SOLID STATE THERMISTOR SWITCH
[75] Inventor: Douglas I. Fales, Flint, Mich.
[73] Assignee: General Motors Corporation, Detroit, Mich.
[22] Filed: Aug. 4, 1975
[21] Appl. No.: 601,597
[52] U.S. Cl. .............................. 340/244 A; 73/295; 200/84 R; 340/274 R
[51] Int. Cl.² ........................................ G08B 21/00
[58] Field of Search .......... 340/244, 274, 417, 280, 340/282, 228; 338/22; 317/41, 132; 323/68; 73/295, 204; 137/392; 62/125–132; 200/84 R, 52 R, 61.2, 61.21

[56] References Cited
UNITED STATES PATENTS

| | | | |
|---|---|---|---|
| 2,741,468 | 4/1956 | Alspaugh | 340/228 R X |
| 3,246,210 | 4/1966 | Lorenz | 317/132 X |
| 3,631,440 | 12/1971 | Cliffgard | 340/244 C |
| 3,756,524 | 9/1973 | Felix | 340/239 R X |
| 3,896,658 | 7/1975 | Hahn | 73/17 A |

Primary Examiner—John W. Caldwell
Assistant Examiner—Daniel Myer
Attorney, Agent, or Firm—Warren D. Hill

[57] ABSTRACT

A switch includes a self-heating thermistor which has a certain resistance value when exposed to a medium of low thermal conductivity and a thermally conductive solid for movement into contact with the thermistor to lower its temperature and change its resistance. The solid is moved relative to the thermistor in response to any mechanical movement such as a float responding to liquid level or the closure of a door.

2 Claims, 3 Drawing Figures

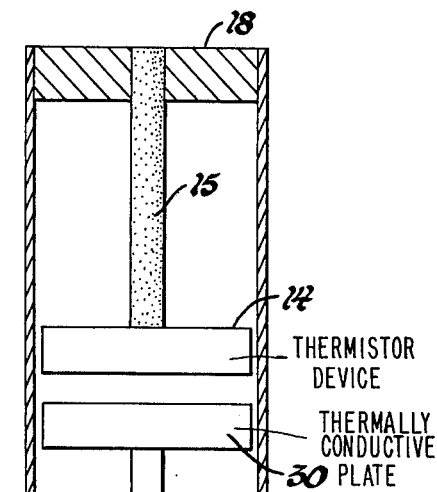
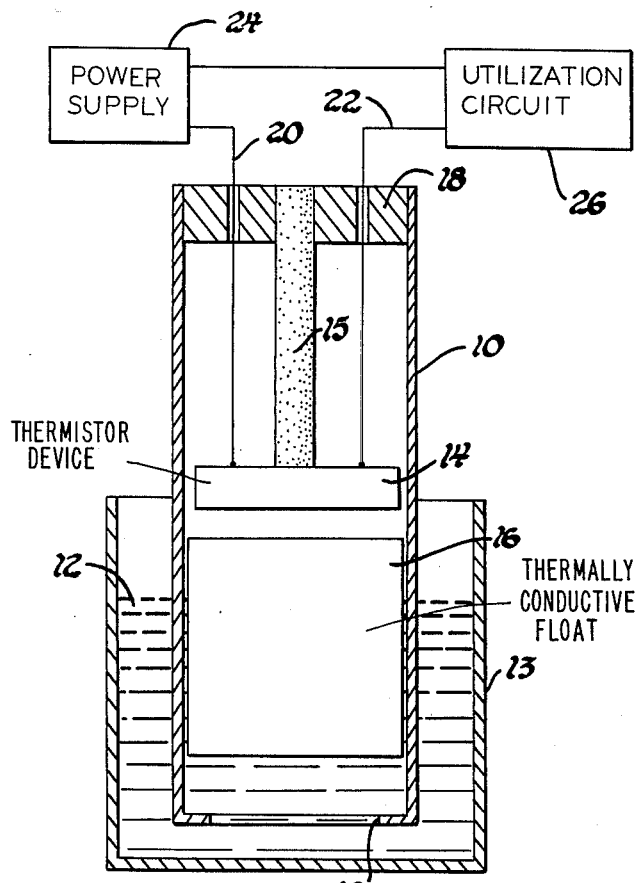
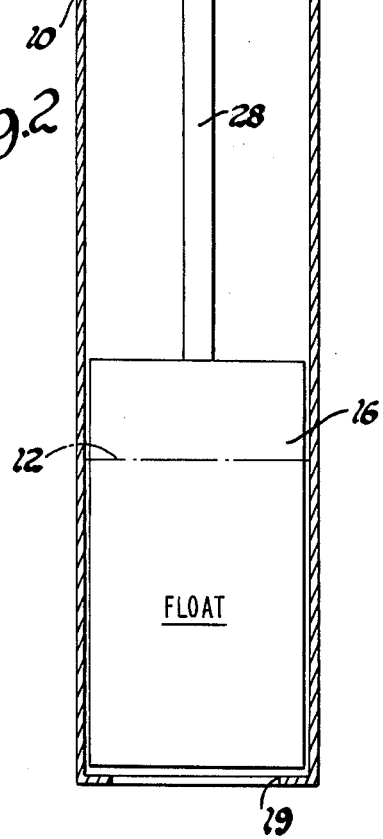
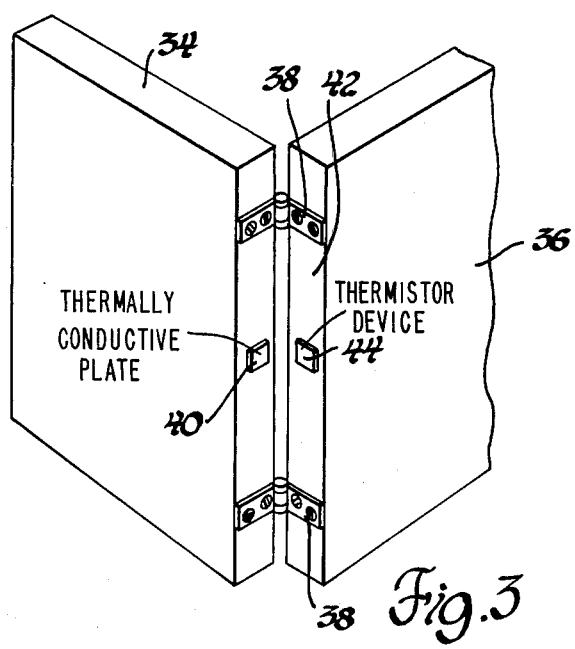

SOLID STATE THERMISTOR SWITCH

This invention relates to condition responsive switches and particularly to a soid state switch incorporating a thermistor.

It is well known that the electrical resistance of a thermistor changes markedly with changing temperature. It is further known that liquid level switches depending on that thermistor characteristic have been proposed wherein a self-heating thermistor is exposed to air or some other medium of low thermal conductivity to cause the thermistor to reach a high temperature and one value of electrical resistance to denote low liquid and when liquid levels become sufficiently high to immerse the thermistor the relatively high conductivity of the liquid causes cooling of the thermistor so that it attains a different resistance value. A warning circuit or other utilization circuit responds to the change of resistance value to make use of the liquid level information.

Shortcomings of that type of thermistor switch are: (1) a liquid must be present in the system, (2) the switch is useful only for detection of liquid level and (3) the liquid must have a substantially higher thermal conductivity than the air or other medium which alternatively surrounds the thermistor. Not all liquids have a sufficiently high thermal conductivity to satisfactorily operate a thermistor switch.

It is therefore an object of this invention to provide a thermistor switch which is operable with or without the presence of liquid and, when liquid is used in the system, is independent of the thermal conductivity of the liquid.

The invention is carried out by providing a self-heating thermistor which in one state is immersed in a medium of low thermal conductivity to provide one value of thermistor resistance, and a solid state medium of high thermal conductivity for movement into thermal contact with the thermistor to change thermistor resistance to another value.

The above and other advantages will be made more apparent from the following specification taken in conjunction with the accompanying drawings wherein like reference numerals refer to like parts and wherein;

FIG. 1 is an elevational view of a liquid level switch according to the invention;

FIG. 2 is a modified form of the switch of FIG. 1, and;

FIG. 3 is a perspective view of a door switch utilizing a thermistor switch according to the invention.

In FIG. 1, a liquid level switch comprising a vertically disposed cylindrical housing 10 is partially immersed in a body of liquid 12 within a container 13. The housing contains a thermistor device 14 carried by a heating insulating element 15 which is rigidly secured to the upper portion of the housing 10 by a member 18. Since many structural forms for thermistors and protective encapsulating holders for thermistors are well known in the art, details of the structure of the thermistor device 14 are not provided here. The housing 10 further contains a float 16 situated below the thermistor device 14, the float being carried by the liquid 12 which is free to enter the housing through an opening 19 in the bottom thereof. The float is free to move in the housing 10 into contact with the thermistor device 14 or out of contact therewith according to the liquid level. The float is made of material having high thermal conductivity such as copper or steel. Alternatively, the buoyant lower portion of the float may be formed of material having low thermal conductivity which carries an upper portion of high thermal conductivity solid to make thermal contact with the thermistor device 14. In either event, the top portion of the float whether integral therewith or separate will be moved into thermal contact with the thermistor device 14 at high liquid level to cool the thermistor and is moved away from the thermistor device as liquid level drops to allow thermistor heating. The thermistor is connected by leads 20 and 22 to a power supply 24 and a utilization circuit 26. The power supply provides current to the thermistor device to cause thermistor heating and in addition operates the utilization circuit. In its simplest form, the utilization circuit 26 may be a lamp which is illuminated when the thermistor achieves a low resistance and which is effectively turned off when the thermistor has a high resistance thereby providing a liquid level indication.

FIG. 2 depicts a modification of the liquid level switch of FIG. 1 wherein the housing is elongated so that the thermistor device 14 may be spaced remotely from the float 16. A push rod 28 secured to the top of the float 16 carries a thermally conducting plate 30 at its upper end near the thermistor device 14 to make or break thermal contact therewith according to the liquid level. A plastic foam annulus 32 within the housing prevents splashing of the liquid 12 into the upper portion of the housing and allows passage of the push rod 28 through its central aperture.

In FIG. 3, a door 34 secured to a support member by hinges 38 carries a highly conductive plate 40 preferably of metal while the door jamb 42 upon the support 36 carries a thermistor device 44. Thus when the door is closed, the conductive plate 40 contacts thermistor 44 to effect cooling thereof and a change of resistance.

It will be understood, of course, that in the examples of FIGS. 2 and 3 that the power supply and utilization circuit of FIG. 1 is included although for reasons of simplicity, they are not expressly shown.

It will thus be recognized that the thermistor switch described above is more flexible in application than previously known thermistor switches and in particular it is not limited to use with a liquid of high thermal conductivity as a cooling agent.

The embodiments of the invention in which an exclusive property or privilege is claimed are defined as follows:

1. A condition responsive switch coupled with a current supply comprising a thermistor means connected to the current supply to develop a relatively high temperature and one resistance value when exposed to a medium of low thermal conductivity and a lower temperature and a substantially different resistance value when exposed to a medium of relatively high thermal conductivity, a solid state medium of high thermal conductivity having a first position in thermal contact with the thermistor means to effect cooling thereof and a second position out of thermal contact with the thermistor means to allow heating thereof, means responsive to a condition for moving the solid state medium between said first position and said second position, and, means responsive to the resistance value of the thermistor means to thereby indicate whether the solid state medium is in said first position or said second position thereby providing an indication of the condition.

2. A liquid level switch coupled with a current supply comprising a thermistor means connected to the current supply to develop a relatively high temperature and one resistance value when exposed to a medium of low thermal conductivity and a lower temperature and a substantially different resistance value when exposed to a medium of relatively high thermal conductivity, a float in the liquid assuming a position according to the liquid level, a metallic member of high thermal conductivity selectively moved by the float according to changes of the liquid level into thermal contact with the thermistor means to effect cooling thereof and out of thermal contact with the thermistor means to allow heating thereof, and means responsive to the resistance value of the thermistor means to indicate whether the metallic member is in contact with the thermistor means thereby providing an indication of the liquid level.

* * * * *